(12) United States Patent
Liu et al.

(10) Patent No.: US 10,694,616 B2
(45) Date of Patent: Jun. 23, 2020

(54) FILAMENT POWER SUPPLY FOR ELECTRON ACCELERATOR AND ELECTRON ACCELERATOR

(71) Applicant: NUCTECH COMPANY LIMITED, Beijing (CN)

(72) Inventors: Jinsheng Liu, Beijing (CN); Yaohong Liu, Beijing (CN); Wei Jia, Beijing (CN); Xinshui Yan, Beijing (CN); Wei Li, Beijing (CN)

(*) Notice: Subject to any disclaimer, the term of this patent is extended or adjusted under 35 U.S.C. 154(b) by 0 days.

(21) Appl. No.: 16/667,849

(22) Filed: Oct. 29, 2019

(65) Prior Publication Data
US 2020/0137868 A1   Apr. 30, 2020

(30) Foreign Application Priority Data
Oct. 29, 2018   (CN) .......................... 2018 1 1266208

(51) Int. Cl.
| H01J 7/44 | (2006.01) |
| H05H 7/02 | (2006.01) |
| H02H 9/02 | (2006.01) |
| H03K 7/08 | (2006.01) |
| H01J 37/248 | (2006.01) |

(52) U.S. Cl.
CPC ................ H05H 7/02 (2013.01); H02H 9/02 (2013.01); H03K 7/08 (2013.01); *H01J 37/248* (2013.01); *H01J 2237/0473* (2013.01); *H05H 2007/022* (2013.01)

(58) Field of Classification Search
CPC .......................... H01J 37/248; H01J 2237/0473
See application file for complete search history.

(56) References Cited

U.S. PATENT DOCUMENTS

| 3,605,009 A | * | 9/1971 | Enge | ..................... H01J 37/241 |
| | | | | 323/293 |
| 3,895,254 A | * | 7/1975 | Minamikawa | .......... H01J 37/06 |
| | | | | 315/57 |

(Continued)

FOREIGN PATENT DOCUMENTS

GB   2258958 A   2/1993

OTHER PUBLICATIONS

EP Search Report dated Mar. 18, 2020 in the corresponding EP application(application No. 19205907.9).

*Primary Examiner* — Thuy V Tran
(74) *Attorney, Agent, or Firm* — Kilpatrick Townsend & Stockton, LLP

(57) ABSTRACT

The present disclosure provides a filament power supply for an electron accelerator and an electron accelerator. The filament power supply includes: a rectifier circuit configured to convert a power frequency AC voltage signal into a DC voltage signal; an inverter circuit configured to convert the DC voltage signal into an AC voltage signal; a sampling circuit configured to sample the AC voltage signal to obtain a current sampling signal or a voltage sampling signal; a pulse width modulation control chip configured to adjust a pulse width modulation signal until a voltage of the current sampling signal is equal to that of a reference current signal, or a voltage of the voltage sampling signal is equal to that of a reference voltage signal; a modulation circuit configured to modulate the power frequency AC voltage signal to obtain a modulation signal and output the pulse width modulation signal and the modulation signal.

20 Claims, 4 Drawing Sheets

(56) References Cited

U.S. PATENT DOCUMENTS

| | | | |
|---|---|---|---|
| 4,034,280 A | | 7/1977 | Cronin et al. |
| 4,703,234 A | * | 10/1987 | Kato ............... H01J 37/248 |
| | | | 174/13 |
| 5,418,707 A | | 5/1995 | Lange et al. |
| 5,502,633 A | | 3/1996 | Ben-Brahim et al. |
| 5,930,125 A | * | 7/1999 | Hitchcock ............ H03K 3/57 |
| | | | 363/26 |
| 2011/0157935 A1 | | 6/2011 | Bancroft |
| 2016/0111968 A1 | * | 4/2016 | Zou ................. H02M 5/458 |
| | | | 363/37 |

* cited by examiner

FILAMENT POWER SUPPLY FOR ELECTRON ACCELERATOR AND ELECTRON ACCELERATOR

CROSS-REFERENCES TO RELATED APPLICATIONS

The present application claims priority to China Patent Application No. 201811266208.2 filed on Oct. 29, 2018, the disclosure of which is incorporated by reference herein in its entirety.

FIELD

The present disclosure relates to the field of electron accelerator, and especially to a filament power supply for an electron accelerator and an electron accelerator.

BACKGROUND

In an electron accelerator, when an electron gun emits electrons, a filament in the electron gun needs to be heated to a certain temperature and maintained at this temperature. The filament needs to be suspended at a negative high voltage to pull electrons out of a cathode.

In a conventional manner, in order to avoid an excessive power of a filament power supply, the voltage of the filament power supply level is increased gradually level by level to heat the filament. For example, when the filament is at a lower temperature, the filament is of a smaller resistance. At this time, the voltage of the filament power supply is adjusted to be at a lower voltage level to heat the filament. When the filament is at a higher temperature, the filament is of a greater resistance. At this time, the voltage of the filament power supply is adjusted to be at a higher voltage level to heat the filament.

SUMMARY

According to one embodiments of the present disclosure, a filament power supply for an electron accelerator is provided. The filament power supply comprises: a rectifier circuit configured to convert a power frequency AC voltage signal into a DC voltage signal; an inverter circuit configured to convert the DC voltage signal into an AC voltage signal and output the AC voltage signal; a sampling circuit configured to sample at least one of a current or a voltage of the AC voltage signal to obtain at least one of a current sampling signal or a voltage sampling signal; a pulse width modulation control chip configured to adjust a duty cycle of a pulse width modulation signal output by the pulse width modulation control chip until a voltage of the current sampling signal is equal to that of a reference current signal, or a voltage of the voltage sampling signal is equal to that of a reference voltage signal; and a modulation circuit configured to modulate the power frequency AC voltage signal according to the pulse width modulation signal to obtain a modulation signal and output the power frequency AC voltage signal and the modulation signal to the inverter circuit to trigger the inverter circuit to convert the DC voltage signal into the AC voltage signal.

In some embodiments, an absolute value of a difference between the voltage of the current sampling signal and the voltage of the reference current signal is a first value, and an absolute value of a difference between the voltage of the voltage sampling signal and the voltage of the reference voltage signal is a second value; the pulse width modulation control chip is configured to adjust the duty cycle of the pulse width modulation signal until the voltage of the current sampling signal is equal to that of the reference current signal in a case where the first value is greater than the second value; and adjust the duty cycle of the pulse width modulation signal until the voltage of the voltage sampling signal is equal to that of the reference current signal in a case where the first value is less than the second value.

In some embodiments, a voltage of the power frequency AC voltage signal is a voltage between a first node and a second node; the modulation circuit comprises: a first sampling resistor, of which a first terminal is grounded, and a second terminal is connected to the first node via a first resistor; a second sampling resistor, of which a first terminal is grounded, and a second terminal is connected to a first DC output terminal of the rectifier circuit via a second resistor; a third sampling resistor, of which a first terminal of is grounded, and a second terminal is connected to the second node via a third resistor; a first NAND gate, of which a first input terminal is connected to the second terminal of the first sampling resistor, a second input terminal is configured to receive a power supply voltage signal, a third input terminal is connected to the second terminal of the second sampling resistor, and an output terminal is configured to output the power frequency AC voltage signal; a second NAND gate, of which a first input terminal is connected to the second terminal of the third sampling resistor, a second input terminal is configured to receive the power supply voltage signal, a third input terminal is connected to the second terminal of the second sampling resistor, and an output terminal is configured to output the power frequency AC voltage signal; a third NAND gate, of which a first input terminal and a second input terminal are connected to the output terminal of the first NAND gate; a fourth NAND gate, of which a first input terminal and a second input terminal are connected to the output terminal of the second NAND gate; a fifth NAND gate, of which a first input terminal is connected to an output terminal of the third NAND gate, a second input terminal is configured to receive the pulse width modulation signal, and an output terminal is configured to output the modulation signal; and a sixth NAND gate, of which a first input terminal is connected to an output terminal of the fourth NAND gate, a second input terminal is configured to receive the pulse width modulation signal, and an output terminal is configured to output the modulation signal.

In some embodiments, the output terminal of the first NAND gate is connected to a fourth input terminal of the second NAND gate, and the output terminal of the second NAND gate is connected to a fourth input terminal of the first NAND gate.

In some embodiments, the filament power supply further comprises: a soft start circuit configured to control the pulse width modulation control chip not to output the pulse width modulation signal in a case where neither the third NAND gate nor the fourth NAND gate outputs the modulation signal.

In some embodiments, the soft start circuit comprises: a first diode, of which a first terminal is connected to the output terminal of the third NAND gate; a second diode, of which a first terminal of the second diode is connected to the output terminal of the fourth NAND gate; a first transistor, of which a control electrode is connected to a second terminal of the first diode and a second terminal of the second diode via a fourth resistor, and a first electrode is grounded; a third diode, of which a first terminal is connected to a second electrode of the first transistor and connected, via a fifth resistor, to a first voltage terminal, and a second terminal is connected to a first port of the pulse width modulation control chip; and a second transistor, of which a control electrode is connected to the second electrode of the first transistor via a sixth resistor, a first electrode is grounded, and a second electrode is connected to a second port of the pulse width modulation control chip.

In some embodiments, the inverter circuit comprises: a first switch, of which a control electrode is connected to the output terminal of the fifth NAND gate, a first electrode is connected to the first DC output terminal of the rectifier circuit, and a second electrode is connected to a first AC output terminal of the inverter circuit; a second switch, of which a control electrode is connected to the output terminal of the sixth NAND gate, a first electrode is connected to the first AC output terminal of the inverter circuit, and a second electrode is connected to a second DC output terminal of the rectifier circuit; a third switch, of which a control electrode is connected to the output terminal of the second NAND gate, a first electrode is connected to the first DC output terminal of the rectifier circuit, and a second electrode is connected to a second AC output terminal of the inverter circuit; and a fourth switch, of which a control electrode is connected to the output terminal of the first NAND gate, a first electrode is connected to the second AC output terminal of the inverter circuit, and a second electrode is connected to the second DC output terminal of the rectifier circuit.

In some embodiments, each of the first switch, the second switch, the third switch, and the fourth switch comprises an insulated gate bipolar transistor.

In some embodiments, each of the first transistor and the second transistor comprises a bipolar transistor.

In some embodiments, the filament power supply further comprises: a reference signal modulation circuit configured to modulate the reference current signal according to a reference pulse width modulation signal from an external input terminal.

In some embodiments, the reference signal modulation circuit comprises: an optocoupler, of which a first input terminal is connected to the external input terminal via an eighth resistor, a second input terminal is connected to a second voltage terminal, a first output terminal is connected to the pulse width modulation control chip, and a second output terminal is connected to the pulse width modulation control chip via a ninth resistor, a potentiometer, and a seventh resistor.

In some embodiments, the filament power supply further comprises: an overcurrent protection circuit connected between the inverter circuit and the pulse width modulation control chip.

In some embodiments, the overcurrent protection circuit comprises: a tenth resistance; and a third transistor, of which a control electrode is connected to the inverter circuit via the tenth resistor, a first electrode is grounded, and a second electrode is connected to the pulse width modulation control chip.

In some embodiments, the filament power supply further comprises at least one of a first protection circuit, a second protection circuit, a third protection circuit, or a fourth protection circuit, each of which comprising a twelfth resistor, a thirteenth resistor, a diode, and a Zener diode, and in the first protection circuit, a first terminal of the twelfth resistor, a first terminal of the diode, a first terminal of the thirteenth resistor, and a first terminal of the Zener diode are connected to the control electrode of the first switch, a second terminal of the twelfth resistor and a second terminal of the diode are connected to the output terminal of the fifth NAND gate, and a second terminal of the thirteenth resistor and a second terminal of the Zener diode are connected to the second electrode of the first switch; in the second protection circuit, the first terminal of the twelfth resistor, the first terminal of the diode, the first terminal of the thirteenth resistor, and the first terminal of the Zener diode are connected to the control electrode of the second switch, the second terminal of the twelfth resistor and the second terminal of the diode are connected to the output terminal of the sixth NAND gate, and the second terminal of the thirteenth resistor and the second terminal of the Zener diode are connected to the second electrode of the second switch; in the third protection circuit, the first terminal of the twelfth resistor, the first terminal of the diode, the first terminal of the thirteenth resistor, and the first terminal of the Zener diode are connected to the control electrode of the third switch, the second terminal of the twelfth resistor and the second terminal of the diode are connected to the output terminal of the second NAND gate, and the second terminal of the thirteenth resistor and the second terminal of the Zener diode are connected to the second electrode of the third switch; in the fourth protection circuit, the first terminal of the twelfth resistor, the first terminal of the diode, the first terminal of the thirteenth resistor, and the first terminal of the Zener diode are connected to the control electrode of the fourth switch, the second terminal of the twelfth resistor and the second terminal of the diode are connected to the output terminal of the first NAND gate, and the second terminal of the thirteenth resistor and the second terminal of the Zener diode are connected to the second electrode of the fourth switch.

According to another embodiments of the present disclosure, an electron accelerator is provided. The electron accelerator comprises: the filament power supply for an electron accelerator according to any one of the above embodiments.

Embodiments of the present disclosure will become apparent from the following detailed description of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, explain the principles of the present disclosure.

The present disclosure can be understood more clearly from the following detailed description with reference to the accompanying drawings, in which.

It should be understood that the dimensions of the various parts shown in the accompanying drawings are not neces-

DETAILED DESCRIPTION OF THE INVENTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

In a conventional manner of heating the filament, the filament power supply has limited voltage levels, for example, typically three voltage levels. A great change in a current output by the filament power supply will be generated when the filament power supply switches between different voltage levels, which may produce a great impact on the filament and reduce the life of the filament.

In order to solve the above problem, the embodiments of the present disclosure provide the following technical solutions.

Figure 1:
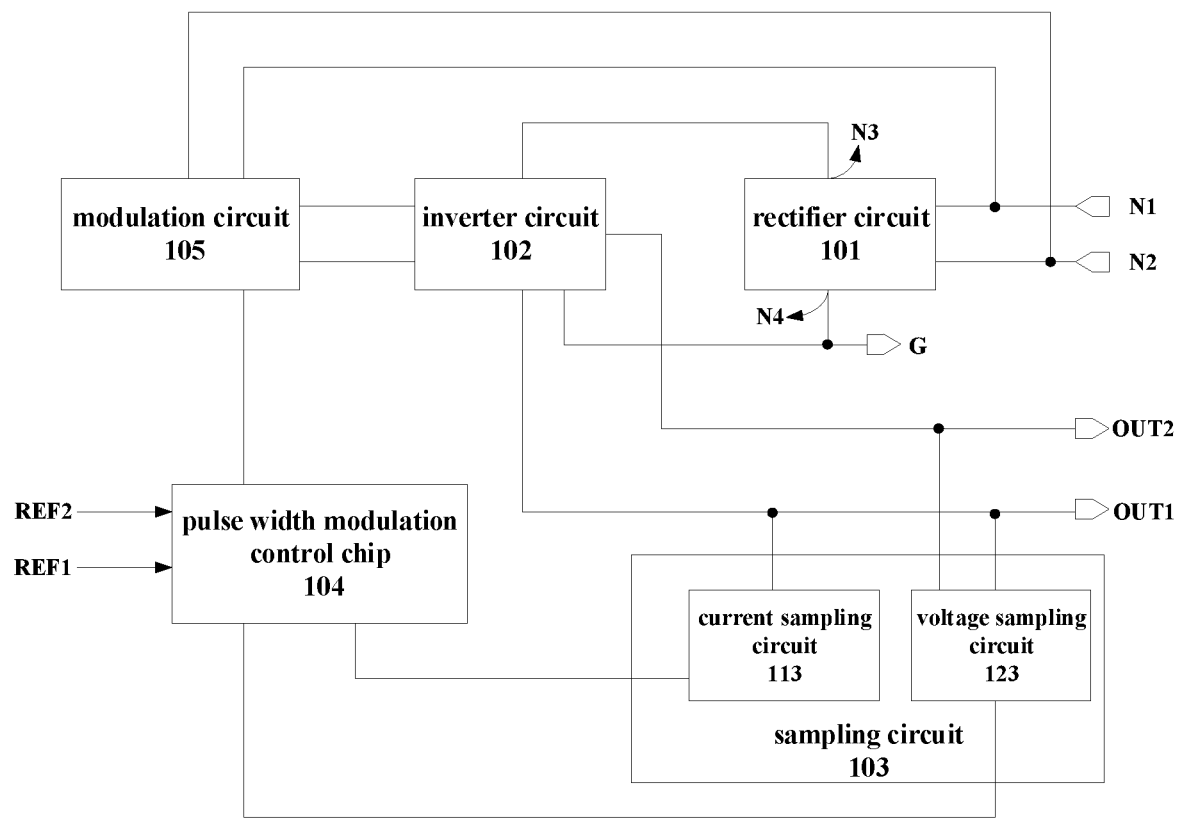
FIG. 1 is a schematic structural view showing a filament power supply for an electron accelerator according to some embodiments of the present disclosure.

FIG. 1 is a schematic structural view showing a filament power supply for an electron accelerator according to some embodiments of the present disclosure.

As shown in FIG. 1, the filament power supply may comprise a rectifier circuit 101, an inverter circuit 102, a sampling circuit 103, a pulse width modulation control chip 104, and a modulation circuit 105.

The rectifier circuit 101 is configured to convert a power frequency alternating current (AC) voltage signal (e.g., a voltage of 220V and a frequency of 50 Hz) into an alternating current (DC) voltage signal. Here, the voltage of the power frequency AC voltage is the voltage between the first node N1 and the second node N2, and the voltage of the DC voltage signal is the voltage between the first DC output terminal N3 and the second DC output terminal N4 of the rectifier circuit 101. For example, the second DC output terminal N4 may be grounded, for example, via a ground terminal G.

The inverter circuit 102 is configured to convert the DC voltage signal into an AC voltage signal and output the AC voltage signal, for example, through the first AC output terminal OUT1 and the second AC output terminal OUT2 of the inverter circuit 102. It should be understood that the first AC output terminal OUT1 and the second AC output terminal OUT2 are also the output terminals of the filament power supply. In some embodiments, the filament power supply may also comprise a filter capacitor (not shown in FIG. 1) connected in parallel between the rectifier circuit 101 and the inverter circuit 102.

The sampling circuit 103 is configured to sample at least one of a current or a voltage of the AC voltage signal output by the inverter circuit 102 to obtain at least one of a current sampling signal or a voltage sampling signal. For example, the sampling circuit 103 may comprise at least one of the current sampling circuit 113 or the voltage sampling circuit 123. The current sampling circuit 113 is configured to sample the current of the AC voltage signal output by the inverter circuit 102 to obtain the current sampling signal. The voltage sampling circuit 123 is configured to sample the voltage of the AC voltage signal output by the inverter circuit 102 to obtain the voltage sampling signal. It should be understood that the current sampling signal here is a voltage signal capable of reflecting the current of the AC voltage signal output by the inverter circuit 102.

The pulse width modulation control chip 104 is configured to adjust a duty cycle of an pulse width modulation signal output by the pulse width modulation control chip 104 until a voltage of the current sampling signal is equal to that of a reference current signal REF1, or a voltage of the voltage sampling signal is equal to that of a reference voltage signal REF2. In some embodiments, the pulse width modulation control chip 104 may be, for example, a LT494 pulse width modulation control chip.

Here, the reference current signal REF1 and the reference voltage signal REF2 may be set according to actual needs. For example, after a desired current and a desired voltage output by the filament power supply is adjusted by a potentiometer, the reference current signal REF1 reflecting the desired current and the reference voltage signal REF2 reflecting the desired voltage may be determined.

In some embodiments, the current sampling circuit 103 is configured to sample only the current of the AC voltage signal output by the inverter circuit 102 to obtain a current sampling signal. In this case, the pulse width modulation control chip 104 is configured to adjust the duty cycle of the pulse width modulation signal until the voltage of the current sampling signal is equal to that of the reference current signal REF1.

In other embodiments, the current sampling circuit 103 is configured to sample only the voltage of the AC voltage signal output by the inverter circuit 102 to obtain a voltage sampling signal. In this case, the pulse width modulation control chip 104 is configured to adjust the duty cycle of the pulse width modulation signal until the voltage of the voltage sampling signal is equal to that of the reference voltage signal REF2.

In still other embodiments, the sampling circuit 103 is configured to sample the current and the voltage of the AC voltage signal output by the inverter circuit 102 to obtain a current sampling signal and a voltage sampling signal. In this case, the pulse width modulation control chip 104 is configured to adjust the duty cycle of the pulse width modulation signal until the voltage of the current sampling signal is equal to that of the reference current signal REF1, or the voltage of the voltage sampling signal is equal to that of the reference voltage signal REF2. In this case, after the duty cycle of the pulse width modulation signal is adjusted, both the current sampling signal and the voltage sampling signal may change. As long as one of the following conditions is satisfied: the voltage of the current sampling signal is equal to that of the reference current signal REF1, and the voltage of the voltage sampling signal is equal to that of the reference voltage signal REF2, the pulse width modulation control chip 104 will no longer adjust the duty cycle of the pulse width modulation signal.

The modulation circuit 105 is configured to modulate the power frequency AC voltage signal according to the pulse width modulation signal output by the pulse width modulation control chip 104 to obtain a modulation signal; and output the power frequency AC voltage signal and the modulation signal to the inverter circuit 102 to trigger the inverter circuit 102 to convert the DC voltage signal into an AC voltage signal.

In the above embodiments, the pulse width modulation control chip adjusts the duty cycle of the pulse width modulation signal until the voltage of the current sampling signal is equal to that of the reference current signal, or the voltage of the voltage sampling signal is equal to that of the reference voltage signal. The modulation circuit modulates the power frequency AC voltage signal according to the pulse width modulation signal to obtain a modulation signal. The modulation circuit outputs the power frequency AC voltage signal and the modulation signal to the inverter circuit to trigger the inverter circuit to convert the DC voltage signal into an AC voltage signal. Such a filament power supply may output a constant current or a constant voltage synchronized with the power frequency AC voltage signal.

The filament power supply provided by the embodiments of the present disclosure uses the power frequency AC (commercial power) as the power source, different voltages may be output without a boosted-voltage DC power source or a bulky voltage regulating transformer. In addition, the filament power supply may output a constant current, thus the impact on the filament during heating is avoided, and the reliability of the filament power supply is improved.

The filament power supply provided by the embodiments of the present disclosure may be used to heat an electron gun filament, a magnetron filament, or a klystron filament, or the like.

In some embodiments, the sampling circuit 103 is configured to sample a current and a voltage of the AC voltage signal output by the inverter circuit 102 to obtain a current sampling signal and a voltage sampling signal. Assume that an absolute value of a difference between the voltage of the current sampling signal and the voltage of the reference current signal REF1 is a first value, and an absolute value of a difference between the voltage of the voltage sampling signal and the voltage of the reference voltage signal REF2 is a second value. The pulse width modulation control chip 105 may be configured to adjust the duty cycle of the pulse width modulation signal until the voltage of the current sampling signal is equal to that of the reference current signal in a case where the first value is greater than the second value; and adjust the duty cycle of the pulse width modulation signal until the voltage of the voltage sampling signal is equal to that of the reference voltage signal in a case where the first value is less than the second value.

For example, if the voltage of the current sampling signal is equal to that of the reference current signal REF1 and the voltage of the voltage sampling signal is less than that of the reference voltage signal REF2, the duty cycle of the pulse width modulation signal will be no longer adjusted. For another example, if the voltage of the voltage sampling signal is equal to that of the reference voltage signal REF2 and the voltage of the current sampling signal is less than that of the reference current signal REF1, the duty cycle of the pulse width modulation signal will be no longer adjusted.

Figure 2:
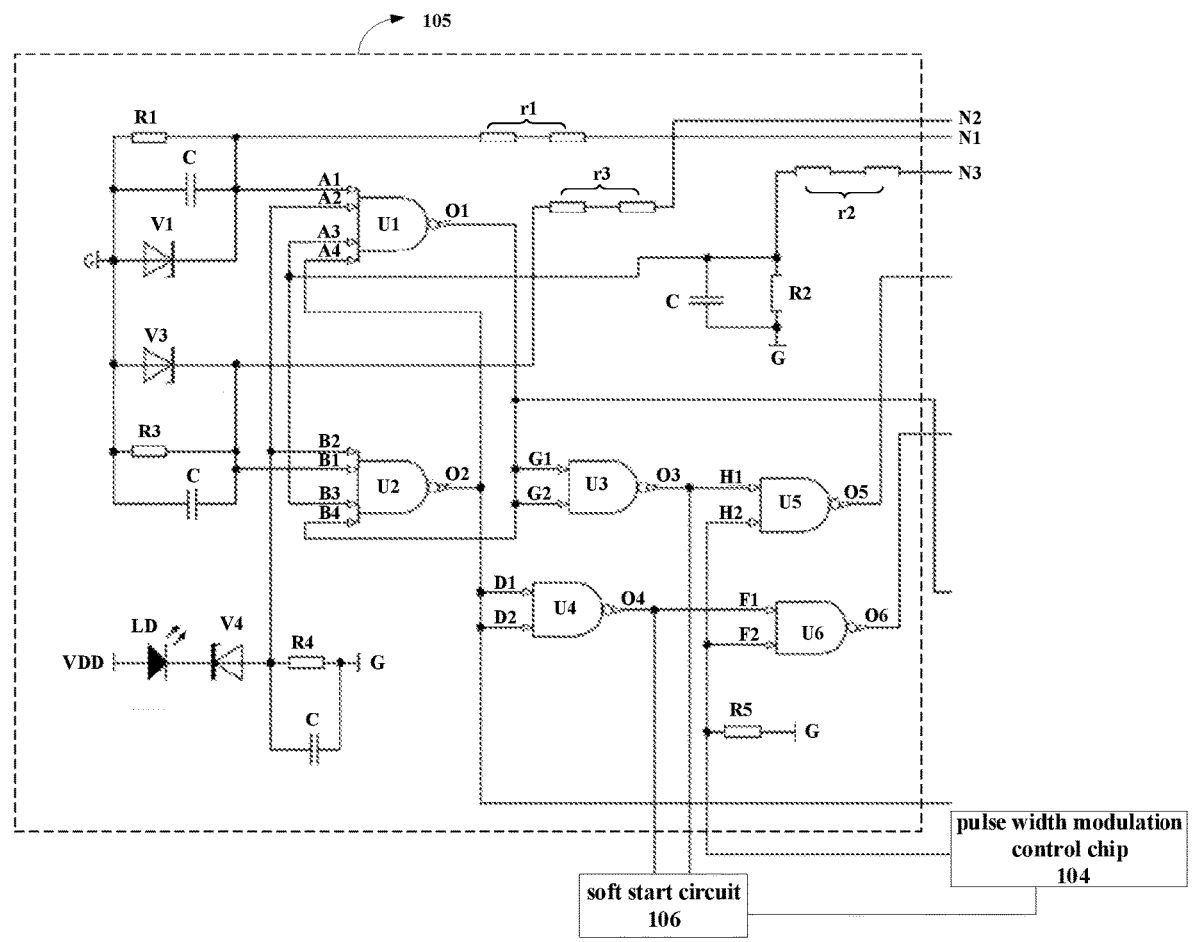
FIG. 2 is a schematic structural view showing a part of a circuit of a filament power supply for an electron accelerator according to other embodiments of the present disclosure.

FIG. 2 is a schematic structural view showing a part of a circuit of a filament power supply for an electron accelerator according to other embodiments of the present disclosure.

As shown in FIG. 2, the modulation circuit 105 comprises a first sampling resistor R1, a second sampling resistor R2, a third sampling resistor R3, a first NAND gate U1, a second NAND gate U2, and a third NAND gate U3, a four NAND gate U4, a fifth NAND gate U5 and a sixth NAND gate U6.

The first terminal of the first sampling resistor R1 is grounded (for example, via a ground terminal G), and the second terminal of the first sampling resistor R1 is connected to the first node N1 via the first resistor r1. In some embodiments, the first sampling resistor R1 may be connected in parallel with at least one of the filter capacitor C or the Zener diode V1.

A first terminal of the second sampling resistor R2 is grounded, and a second terminal of the second sampling resistor R2 is connected to a first DC output terminal N3 of the rectifier circuit 103 via a second resistor r2. In some embodiments, the second sampling resistor R2 may be connected in parallel with the filter capacitor C.

The first terminal of the third sampling resistor R3 is grounded, and the second terminal of the third sampling resistor R3 is connected to the second node N2 via the third resistor r3. In some embodiments, the third sampling resistor R3 may be connected in parallel with at least one of the filter capacitor C or the Zener diode V3.

The first input terminal A1 of the first NAND gate U1 is connected to the second terminal of the first sampling resistor R1, the second input terminal A2 of the first NAND gate is configured to receive a power supply voltage signal, the third input terminal A3 of the first NAND gate U1 is connected to the second terminal of the second sampling resistor R2, and the output terminal O1 of the first NAND gate U1 is configured to output the power frequency AC voltage signal. For example, the output terminal O1 may output the power frequency AC voltage signal to the inverter circuit 102 via an optocoupler.

For example, the modulation circuit 105 may further comprise a fourth sampling resistor R4. The first terminal of the fourth sampling resistor R4 is grounded, and the second terminal of the fourth sampling resistor R4 (for example, via the Zener diode V4) is connected to the power supply voltage terminal VDD (for example, 15V). In some embodiments, the fourth sampling resistor R4 may be connected in parallel with the filter capacitor C. In addition, a light emitting diode LD may also be connected between the power supply voltage terminal VDD and the Zener diode V4.

A first input terminal B1 of the second NAND gate U2 is connected to a second terminal of the third sampling resistor R3, the second input terminal B2 of the second NAND gate U2 is configured to receive the power supply voltage signal, the third input terminal B3 of the second NAND gate U2 is connected to the second terminal of the second sampling resistor R2, and the output terminal O2 of the second NAND gate U2 is configured to output the power frequency AC voltage signal. For example, the output terminal O2 may output the power frequency AC voltage signal to the inverter circuit 102 via an optocoupler.

Here, the first NAND gate U1 and the second NAND gate U2 alternately output the power frequency AC voltage signal. That is, in a case where the first NAND gate U1 outputs the power frequency AC voltage signal, the second NAND gate U2 does not output the power frequency AC voltage signal; in a case where the second NAND gate U2 outputs the power frequency AC voltage signal, the first NAND gate U1 does not output the power frequency AC voltage signal. In order to ensure that the first NAND gate U1 and the second NAND gate U2 alternately output the power frequency AC voltage signal, in some embodiments, the output terminal O1 of the first NAND gate U1 may be connected to the fourth input terminal B4 of the second NAND gate U2, and the output terminal O2 of the second NAND gate U2 may be connected to the fourth input terminal A4 of the first NAND gate U1.

The first input terminal G1 and the second input terminal G2 of the third NAND gate U3 are connected to the output terminal O1 of the first NAND gate U1, and the output terminal O3 of the third NAND gate U3 is connected to the first input terminal E1 of the fifth NAND gate U5.

The first input terminal D1 and the second input terminal D2 of the fourth NAND gate U4 are connected to the output terminal O2 of the second NAND gate U2, and the output terminal O4 of the fourth NAND gate U4 is connected to the first input terminal F1 of the sixth NAND gate U6.

The first input terminal H1 of the fifth NAND gate U5 is connected to the output terminal O3 of the third NAND gate U3, the second input terminal H2 of the fifth NAND gate U5 is configured to receive the pulse width modulation signal output by the pulse width modulation control chip 104, and the output terminal O5 of the fifth NAND gate U5 is configured to output the modulation signal. For example, the output terminal O5 may output the modulation signal to the inverter circuit 102 via an optocoupler.

The first input terminal F1 of the sixth NAND gate U6 is connected to the output terminal O4 of the fourth NAND gate U4, the second input terminal F2 of the sixth NAND gate U6 is configured to receive the pulse width modulation signal, and the output terminal O6 of the sixth NAND gate U6 is configured to output the modulation signal. For example, the output terminal O6 may output the modulation signal to the inverter circuit 102 via an optocoupler.

In some embodiments, the modulation circuit 105 may also comprise a fifth sampling resistor R5. The first terminal of the fifth sampling resistor R5 is grounded, and the second terminal of the fifth sampling resistor R5 is connected to the output terminal of the pulse width modulation control chip 104.

Here, the fifth NAND gate U5 and the sixth NAND gate U6 alternately output the modulation signal. In a case where the first NAND gate U1 outputs the power frequency AC voltage signal, the fifth NAND gate U5 outputs the modulation signal; in a case where the second NAND gate U2 outputs the power frequency AC voltage signal, the sixth NAND gate U6 outputs the modulation signal. The power frequency AC voltage signal and the modulation signal may trigger the inverter circuit 102 to convert a DC voltage signal into an AC voltage signal.

In some embodiments, referring to FIG. 2, the filament power supply may also comprise a soft start circuit 106. The soft start circuit 106 is configured to control the pulse width modulation control chip 104 not to output the pulse width modulation signal in a case where neither the third NAND gate U3 nor the fourth NAND gate U4 outputs the modulation signal. In addition, the soft start circuit 106 is further configured to control the pulse width modulation control chip 104 to output the pulse width modulation signal in a case where one of the third NAND gate U3 and the fourth NAND gate U4 outputs the modulation signal while the other does not output the modulation signal.

Figure 3:
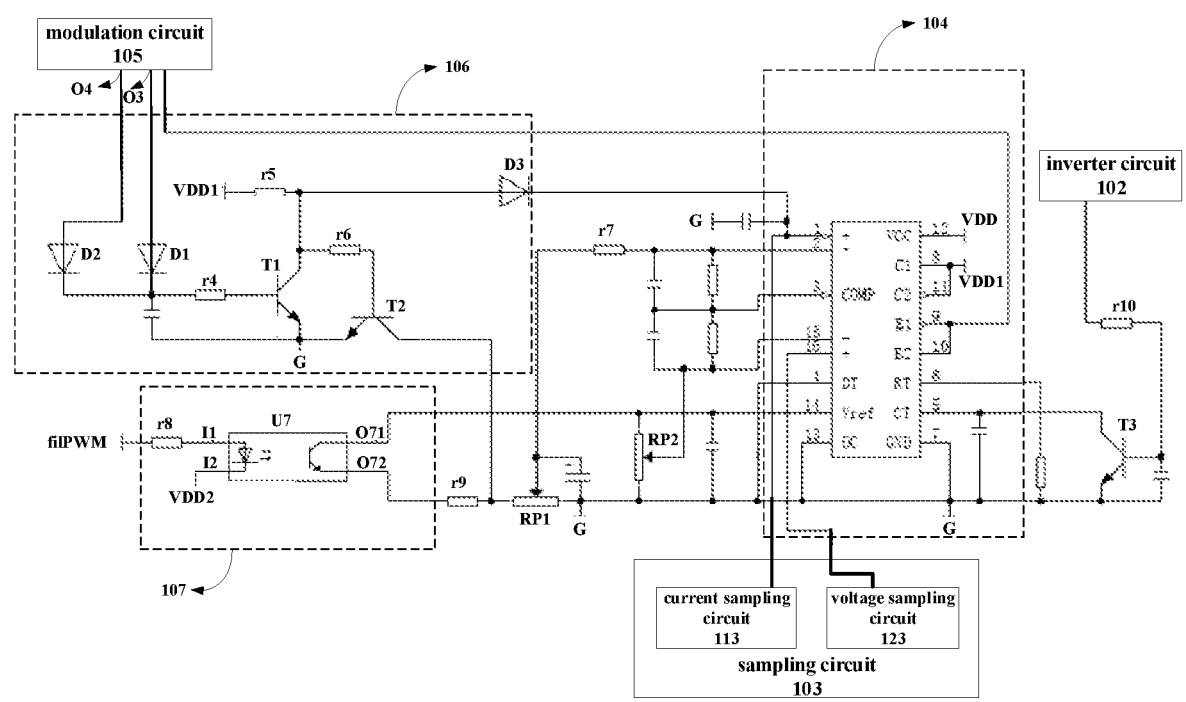
FIG. 3 is a schematic structural view showing a part of a circuit of a filament power supply for an electron accelerator according to still other embodiments of the present disclosure.

FIG. 3 is a schematic structural view showing a part of a circuit of a filament power supply for an electron accelerator according to still other embodiments of the present disclosure.

As shown in FIG. 3, the soft start circuit 106 comprises a first diode D1, a second diode D2, a third diode D3, a first transistor T1, and a second transistor T2. In some embodiments, each of the first transistor T1 and the second transistor T2 may comprise, but are not limited to, a bipolar transistor.

The first terminal of the first diode D1 is connected to the output terminal O3 of the third NAND gate U3, and the second terminal of the first diode D1 is connected to the control electrode of the first transistor T1 via the fourth resistor r4. The first terminal of the second diode D2 is connected to the output terminal O4 of the fourth NAND gate U4, and the second terminal of the second diode D2 is connected to the control electrode of the first transistor T1 via the fourth resistor r4. The control electrode of the first transistor T1 is connected to the second terminal of the first diode D1 and the second terminal of the second diode D2 via the fourth resistor r4, the first electrode of the first transistor T1 is grounded, and the second electrode of the first transistor T1 is connected to the first terminal of the third diode D3. The first terminal of the third diode D3 is connected to the second electrode of the first transistor T1, and connected to the first voltage terminal VDD1 (for example, 5V) via the fifth resistor r5, and the second terminal of the third diode D3 is connected to the first port 1 (referred to as port 1 for short) of the pulse width modulation control chip 104. The control electrode of the second transistor T2 is connected to the second electrode of the first transistor T1 via the sixth resistor r6, the first electrode of the second transistor T2 is grounded, and the second electrode of the second transistor T2 is connected to the second port 2 (referred to as the port 2 for short) of the pulse width modulation control chip 104.

It should be noted that FIG. 3 also shows a potentiometer RP1 and a potentiometer RP2 connected between the port 14 of the pulse width modulation control chip 104 and the ground terminal G. The voltage between the port 14 and the ground terminal G is a reference voltage Vref (for example, 5V) output by the pulse width modulation control chip 104. The desired current output by the filament power supply may be adjusted by the potentiometer RP1, and the desired voltage output by the filament power supply may be adjusted by the potentiometer RP2. The second electrode of the second transistor T2 may be connected to the port 2 of the pulse width modulation control chip 104 via the potentiometer RP1 and the seventh resistor r7.

It should be understood that although FIG. 3 is shown with a resistor and a capacitor connected between the port 2 and the port 3, and a resistor and a capacitor connected between the port 15 and the port 3, this is not restrictive.

In some cases, a part of the electrons (referred to as the back-bombardment electrons) emitted from the cathode may be reversely accelerated back to the cathode. In a case of numerous back-bombardment electrons, the temperature produced by the back-bombardment electrons can maintain the temperature required by the filament. At this time, the current of the filament power supply needs to be reduced.

In some embodiments, referring to FIG. 3, the filament power supply may also comprise a reference signal modulation circuit 107. The reference signal modulation circuit 107 is configured to modulate the reference current signal according to a reference pulse width modulation signal filPWM from an external input terminal to control the current output by the filament power supply, for example, reduce the current output by the filament power supply. In this manner, the current output by the filament power supply can be more precisely controlled.

For example, the reference signal modulation circuit 107 may comprise an optocoupler U7. The first input terminal I1 of the optocoupler U7 is connected to the external input terminal via the eighth resistor r8, the second input terminal I2 of the optocoupler U7 is connected to the second voltage terminal VDD2, the first output terminal O71 of the optocoupler U7 is connected to the pulse width modulation control chip 104 (e.g., the port 14), and the second output terminal O72 of the optocoupler U7 may be connected to the pulse width modulation control chip 104 (e.g., the port 2) via the ninth resistor r9, the potentiometer RP1, and the seventh resistor r7.

In some embodiments, referring to FIG. 3, the filament power supply may also comprise an overcurrent protection circuit connected between the inverter circuit 102 and the pulse width modulation control chip 104. The overcurrent protection circuit may comprise a tenth resistor r10 and a third transistor T3. A control electrode of the third transistor T3 is connected to the inverter circuit 102 via a tenth resistor r10, the first electrode of the third transistor T3 is grounded, and the second electrode of the third transistor T3 is connected to the pulse width modulation control chip 105 (e.g. the port 5).

Figure 4:
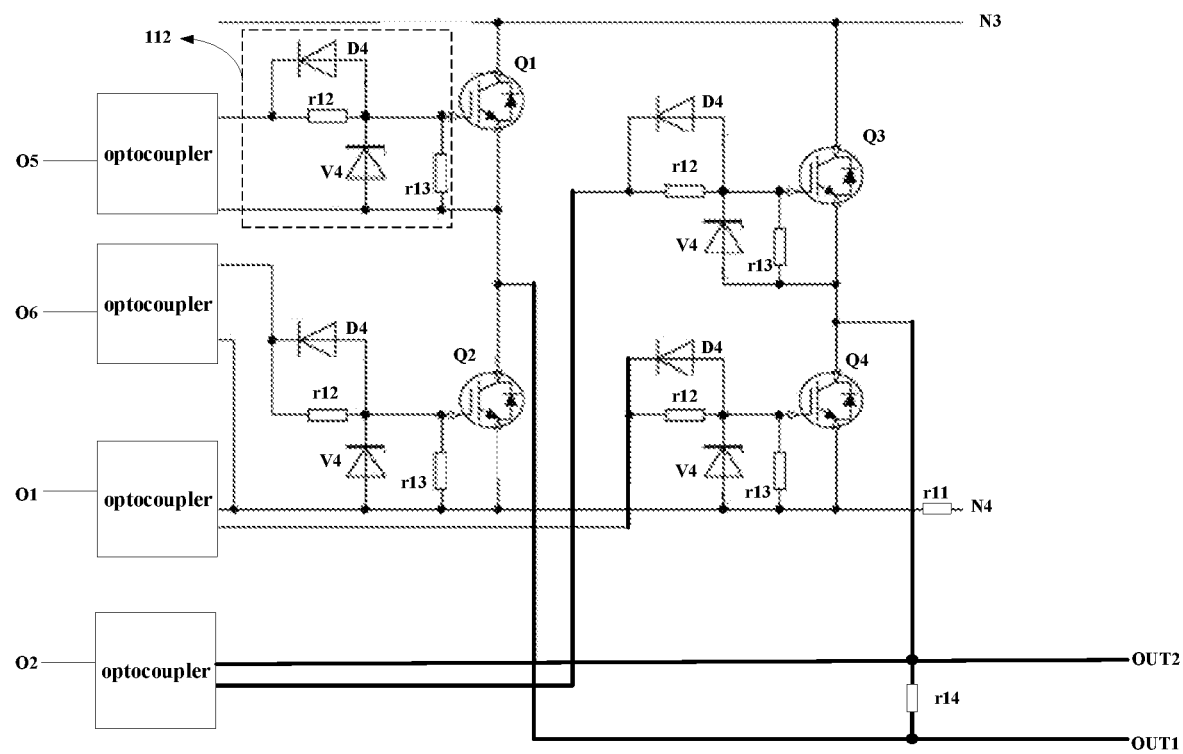
FIG. 4 is a schematic structural view showing a part of a circuit of a filament power supply for an electron accelerator according to yet still other embodiments of the present disclosure.

FIG. 4 is a schematic structural view showing a part of a circuit of a filament power supply for an electron accelerator according to yet still other embodiments of the present disclosure.

As shown in FIG. 4, the inverter circuit 102 comprises a first switch Q1, a second switch Q2, a third switch Q3, and a fourth switch Q4. In some embodiments, each of the first switch Q1, the second switch Q2, the third switch Q3, and the fourth switch Q4 may comprise, but not limited to, an insulated gate bipolar transistor (IGBT).

The control electrode of the first switch Q1 is connected to the output terminal O5 of the fifth NAND gate U5 (for example, via an optocoupler), the first electrode of the first switch Q1 is connected to the first DC output terminal N3 of the rectifier circuit 101, and the second electrode of the first switch Q1 is connected to the first AC output terminal OUT1 of the inverter circuit 102.

The control electrode of the second switch Q2 is connected to the output terminal O6 of the sixth NAND gate U6 (for example via an optocoupler), the first electrode of the second switch Q2 is connected to the first AC output terminal OUT1 of the inverter circuit 102, and the second electrode of the second switch Q2 is connected to the second DC output terminal N4 of the rectifier circuit 101 (for example via an eleventh resistor r11).

The control electrode of the third switch Q3 is connected to the output terminal O2 of the second NAND gate U2 (for example via an optocoupler), the first electrode of the third switch Q3 is connected to the first DC output terminal N3 of the rectifier circuit 101, and the second electrode of the third switch Q3 is connected to the second AC output terminal OUT2 of the inverter circuit 102.

The control electrode of the fourth switch Q4 is connected to the output terminal O1 of the first NAND gate U1 (for example via an optocoupler), the first electrode of the fourth switch Q4 is connected to the second AC output terminal OUT2 of the inverter circuit 102, and the second electrode of the fourth switch Q4 is connected to the second DC output terminal N4 of the rectifier circuit 101 (for example via the eleventh resistor r11).

In some embodiments, referring to FIG. 4, the inverter circuit 102 may also comprise at least one protection circuit 112. The protection circuit 112 comprises a resistor r12 (i.e., a twelfth resistor), a resistor r13 (i.e., a thirteenth resistor), a diode D4, and a Zener diode V4.

First, the protection circuit 112 connected to the first switch Q1 and the output terminal O5 of the fifth NAND gate U5, that is, the first protection circuit will be introduced.

The first terminal of the resistor r12, the first terminal of the diode D4, the first terminal of the resistor r13, and the first terminal of the Zener diode V4 are connected to the control electrode of the first switch Q1, the second terminal of the resistor r12 and the second terminal of the diode D4 are connected to the output terminal O5 of the fifth NAND gate U5 (for example, via an optocoupler), and the second terminal of the resistor r13 and the second terminal of the Zener diode V14 are connected to the second electrode of the first switch Q1.

Next, the protection circuit 112 connected to the second switch Q2 and the output terminal O6 of the sixth NAND gate U6, that is, the second protection circuit will be introduced.

The first terminal of the resistor r12, the first terminal of the diode D4, the first terminal of the resistor r13, and the first terminal of the Zener diode V4 are connected to the control electrode of the second switch Q2, the second terminal of the resistor r12 and the second terminal of the diode D4 are connected to the output terminal O6 of the sixth NAND gate U6 (for example, via an optocoupler), and the second terminal of the resistor r13 and the second terminal of the Zener diode V14 are connected to the second electrode of the second switch Q2.

Next, the protection circuit 112 connected to the third switch Q3 and the output terminal O2 of the second NAND gate U2, that is, the third protection circuit will be introduced.

The first terminal of the resistor r12, the first terminal of the diode D4, the first terminal of the resistor r13, and the first terminal of the Zener diode V4 are connected to the control electrode of the third switch Q3, the second terminal of the resistor r12 and the second terminal of the diode D4 are connected to the output terminal O2 of the second NAND gate U2 (for example, via an optocoupler), and the second terminal of the resistor r13 and the second terminal of the Zener diode V14 are connected to the second electrode of the third switch Q3.

Next, the protection circuit 112 connected to the fourth switch Q4 and the output terminal O1 of the first NAND gate U1, that is, the fourth protection circuit will be introduced.

The first terminal of the resistor r12, the first terminal of the diode D4, the first terminal of the resistor r13, and the first terminal of the Zener diode V4 are connected to the control electrode of the fourth switch Q4, the second terminal of the resistor r12 and the second terminal of the diode D4 are connected to the output terminal O1 of the first NAND gate U1 (for example, via an optocoupler), and the second terminal of the resistor r13 and the second terminal of the Zener diode V14 are connected to the second electrode of the fourth switch Q4.

In some embodiments, a resistor, such as a resistor r14, may be connected between the first AC output terminal OUT1 and the second AC output terminal OUT2.

Embodiments of the present disclosure also provide an electron accelerator. The electron accelerator may comprise the filament power supply for an electron accelerator according to any one of the above embodiments.

The invention claimed is:

1. A filament power supply for an electron accelerator, comprising:
   a rectifier circuit configured to convert a power frequency AC voltage signal into a DC voltage signal;
   an inverter circuit configured to convert the DC voltage signal into an AC voltage signal and output the AC voltage signal;
   a sampling circuit configured to sample at least one of a current or a voltage of the AC voltage signal to obtain at least one of a current sampling signal or a voltage sampling signal;
   a pulse width modulation control chip configured to adjust a duty cycle of a pulse width modulation signal output by the pulse width modulation control chip until a voltage of the current sampling signal is equal to that of a reference current signal, or a voltage of the voltage sampling signal is equal to that of a reference voltage signal; and
   a modulation circuit configured to modulate the power frequency AC voltage signal according to the pulse width modulation signal to obtain a modulation signal and output the power frequency AC voltage signal and the modulation signal to the inverter circuit to trigger the inverter circuit to convert the DC voltage signal into the AC voltage signal.

2. The filament power supply according to claim 1, wherein:
   an absolute value of a difference between the voltage of the current sampling signal and the voltage of the reference current signal is a first value, and an absolute value of a difference between the voltage of the voltage sampling signal and the voltage of the reference voltage signal is a second value;
   the pulse width modulation control chip is configured to adjust the duty cycle of the pulse width modulation signal until the voltage of the current sampling signal is equal to that of the reference current signal in a case where the first value is greater than the second value; and adjust the duty cycle of the pulse width modulation signal until the voltage of the voltage sampling signal is equal to that of the reference current signal in a case where the first value is less than the second value.

3. The filament power supply according to claim 1, wherein a voltage of the power frequency AC voltage signal is a voltage between a first node and a second node;
   the modulation circuit comprises:
   a first sampling resistor, of which a first terminal is grounded, and a second terminal is connected to the first node via a first resistor;
   a second sampling resistor, of which a first terminal is grounded, and a second terminal is connected to a first DC output terminal of the rectifier circuit via a second resistor;
   a third sampling resistor, of which a first terminal of is grounded, and a second terminal is connected to the second node via a third resistor;
   a first NAND gate, of which a first input terminal is connected to the second terminal of the first sampling resistor, a second input terminal is configured to receive a power supply voltage signal, a third input terminal is connected to the second terminal of the second sampling resistor, and an output terminal is configured to output the power frequency AC voltage signal;
   a second NAND gate, of which a first input terminal is connected to the second terminal of the third sampling resistor, a second input terminal is configured to receive the power supply voltage signal, a third input terminal is connected to the second terminal of the second sampling resistor, and an output terminal is configured to output the power frequency AC voltage signal;
   a third NAND gate, of which a first input terminal and a second input terminal are connected to the output terminal of the first NAND gate;
   a fourth NAND gate, of which a first input terminal and a second input terminal are connected to the output terminal of the second NAND gate;
   a fifth NAND gate, of which a first input terminal is connected to an output terminal of the third NAND gate, a second input terminal is configured to receive the pulse width modulation signal, and an output terminal is configured to output the modulation signal; and
   a sixth NAND gate, of which a first input terminal is connected to an output terminal of the fourth NAND gate, a second input terminal is configured to receive the pulse width modulation signal, and an output terminal is configured to output the modulation signal.

4. The filament power supply according to claim 3, wherein the output terminal of the first NAND gate is connected to a fourth input terminal of the second NAND gate, and the output terminal of the second NAND gate is connected to a fourth input terminal of the first NAND gate.

5. The filament power supply according to claim 3, further comprising:
   a soft start circuit configured to control the pulse width modulation control chip not to output the pulse width modulation signal in a case where neither the third NAND gate nor the fourth NAND gate outputs the modulation signal.

6. The filament power supply according to claim 5, wherein the soft start circuit comprises:
   a first diode, of which a first terminal is connected to the output terminal of the third NAND gate;
   a second diode, of which a first terminal of the second diode is connected to the output terminal of the fourth NAND gate;
   a first transistor, of which a control electrode is connected to a second terminal of the first diode and a second terminal of the second diode via a fourth resistor, and a first electrode is grounded;
   a third diode, of which a first terminal is connected to a second electrode of the first transistor and connected, via a fifth resistor, to a first voltage terminal, and a second terminal is connected to a first port of the pulse width modulation control chip; and
   a second transistor, of which a control electrode is connected to the second electrode of the first transistor via a sixth resistor, a first electrode is grounded, and a second electrode is connected to a second port of the pulse width modulation control chip.

7. The filament power supply according to claim 6, wherein each of the first transistor and the second transistor comprises a bipolar transistor.

8. The filament power supply according to claim 3, wherein the inverter circuit comprises:
   a first switch, of which a control electrode is connected to the output terminal of the fifth NAND gate, a first electrode is connected to the first DC output terminal of the rectifier circuit, and a second electrode is connected to a first AC output terminal of the inverter circuit;
   a second switch, of which a control electrode is connected to the output terminal of the sixth NAND gate, a first electrode is connected to the first AC output terminal of the inverter circuit, and a second electrode is connected to a second DC output terminal of the rectifier circuit;
a third switch, of which a control electrode is connected to the output terminal of the second NAND gate, a first electrode is connected to the first DC output terminal of the rectifier circuit, and a second electrode is connected to a second AC output terminal of the inverter circuit; and
a fourth switch, of which a control electrode is connected to the output terminal of the first NAND gate, a first electrode is connected to the second AC output terminal of the inverter circuit, and a second electrode is connected to the second DC output terminal of the rectifier circuit.

9. The filament power supply according to claim 8, wherein each of the first switch, the second switch, the third switch, and the fourth switch comprises an insulated gate bipolar transistor.

10. The filament power supply according to claim 8, further comprising at least one of a first protection circuit, a second protection circuit, a third protection circuit, or a fourth protection circuit, each of which comprising a twelfth resistor, a thirteenth resistor, a diode, and a Zener diode, wherein:
in the first protection circuit, a first terminal of the twelfth resistor, a first terminal of the diode, a first terminal of the thirteenth resistor, and a first terminal of the Zener diode are connected to the control electrode of the first switch, a second terminal of the twelfth resistor and a second terminal of the diode are connected to the output terminal of the fifth NAND gate, and a second terminal of the thirteenth resistor and a second terminal of the Zener diode are connected to the second electrode of the first switch;
in the second protection circuit, the first terminal of the twelfth resistor, the first terminal of the diode, the first terminal of the thirteenth resistor, and the first terminal of the Zener diode are connected to the control electrode of the second switch, the second terminal of the twelfth resistor and the second terminal of the diode are connected to the output terminal of the sixth NAND gate, and the second terminal of the thirteenth resistor and the second terminal of the Zener diode are connected to the second electrode of the second switch;
in the third protection circuit, the first terminal of the twelfth resistor, the first terminal of the diode, the first terminal of the thirteenth resistor, and the first terminal of the Zener diode are connected to the control electrode of the third switch, the second terminal of the twelfth resistor and the second terminal of the diode are connected to the output terminal of the second NAND gate, and the second terminal of the thirteenth resistor and the second terminal of the Zener diode are connected to the second electrode of the third switch;
in the fourth protection circuit, the first terminal of the twelfth resistor, the first terminal of the diode, the first terminal of the thirteenth resistor, and the first terminal of the Zener diode are connected to the control electrode of the fourth switch, the second terminal of the twelfth resistor and the second terminal of the diode are connected to the output terminal of the first NAND gate, and the second terminal of the thirteenth resistor and the second terminal of the Zener diode are connected to the second electrode of the fourth switch.

11. The filament power supply according to claim 1, further comprising:
a reference signal modulation circuit configured to modulate the reference current signal according to a reference pulse width modulation signal from an external input terminal.

12. The filament power supply according to claim 11, wherein the reference signal modulation circuit comprises:
an optocoupler, of which a first input terminal is connected to the external input terminal via an eighth resistor, a second input terminal is connected to a second voltage terminal, a first output terminal is connected to the pulse width modulation control chip, and a second output terminal is connected to the pulse width modulation control chip via a ninth resistor, a potentiometer, and a seventh resistor.

13. The filament power supply according to claim 1, further comprising:
an overcurrent protection circuit connected between the inverter circuit and the pulse width modulation control chip.

14. The filament power supply according to claim 13, wherein the overcurrent protection circuit comprises:
a tenth resistance; and
a third transistor, of which a control electrode is connected to the inverter circuit via the tenth resistor, a first electrode is grounded, and a second electrode is connected to the pulse width modulation control chip.

15. An electron accelerator, comprising a filament power supply for the electron accelerator, wherein the filament power supply comprises:
a rectifier circuit configured to convert a power frequency AC voltage signal into a DC voltage signal;
an inverter circuit configured to convert the DC voltage signal into an AC voltage signal and output the AC voltage signal;
a sampling circuit configured to sample at least one of a current or a voltage of the AC voltage signal to obtain at least one of a current sampling signal or a voltage sampling signal;
a pulse width modulation control chip configured to adjust a duty cycle of a pulse width modulation signal output by the pulse width modulation control chip until a voltage of the current sampling signal is equal to that of a reference current signal, or a voltage of the voltage sampling signal is equal to that of a reference voltage signal; and
a modulation circuit configured to modulate the power frequency AC voltage signal according to the pulse width modulation signal to obtain a modulation signal and output the power frequency AC voltage signal and the modulation signal to the inverter circuit to trigger the inverter circuit to convert the DC voltage signal into the AC voltage signal.

16. The electron accelerator according to claim 15, wherein:
an absolute value of a difference between the voltage of the current sampling signal and the voltage of the reference current signal is a first value, and an absolute value of a difference between the voltage of the voltage sampling signal and the voltage of the reference voltage signal is a second value;
the pulse width modulation control chip is configured to adjust the duty cycle of the pulse width modulation signal until the voltage of the current sampling signal is equal to that of the reference current signal in a case where the first value is greater than the second value; and adjust the duty cycle of the pulse width modulation signal until the voltage of the voltage sampling signal is equal to that of the reference current signal in a case where the first value is less than the second value.

17. The electron accelerator according to claim 15, wherein a voltage of the power frequency AC voltage signal is a voltage between a first node and a second node;

the modulation circuit comprises:
a first sampling resistor, of which a first terminal is grounded, and a second terminal is connected to the first node via a first resistor;
a second sampling resistor, of which a first terminal is grounded, and a second terminal is connected to a first DC output terminal of the rectifier circuit via a second resistor;
a third sampling resistor, of which a first terminal of is grounded, and a second terminal is connected to the second node via a third resistor;
a first NAND gate, of which a first input terminal is connected to the second terminal of the first sampling resistor, a second input terminal is configured to receive a power supply voltage signal, a third input terminal is connected to the second terminal of the second sampling resistor, and an output terminal is configured to output the power frequency AC voltage signal;
a second NAND gate, of which a first input terminal is connected to the second terminal of the third sampling resistor, a second input terminal is configured to receive the power supply voltage signal, a third input terminal is connected to the second terminal of the second sampling resistor, and an output terminal is configured to output the power frequency AC voltage signal;
a third NAND gate, of which a first input terminal and a second input terminal are connected to the output terminal of the first NAND gate;
a fourth NAND gate, of which a first input terminal and a second input terminal are connected to the output terminal of the second NAND gate;
a fifth NAND gate, of which a first input terminal is connected to an output terminal of the third NAND gate, a second input terminal is configured to receive the pulse width modulation signal, and an output terminal is configured to output the modulation signal; and
a sixth NAND gate, of which a first input terminal is connected to an output terminal of the fourth NAND gate, a second input terminal is configured to receive the pulse width modulation signal, and an output terminal is configured to output the modulation signal.

18. The electron accelerator according to claim 17, wherein the output terminal of the first NAND gate is connected to a fourth input terminal of the second NAND gate, and the output terminal of the second NAND gate is connected to a fourth input terminal of the first NAND gate.

19. The electron accelerator according to claim 17, wherein the inverter circuit comprises:
a first switch, of which a control electrode is connected to the output terminal of the fifth NAND gate, a first electrode is connected to the first DC output terminal of the rectifier circuit, and a second electrode is connected to a first AC output terminal of the inverter circuit;
a second switch, of which a control electrode is connected to the output terminal of the sixth NAND gate, a first electrode is connected to the first AC output terminal of the inverter circuit, and a second electrode is connected to a second DC output terminal of the rectifier circuit;
a third switch, of which a control electrode is connected to the output terminal of the second NAND gate, a first electrode is connected to the first DC output terminal of the rectifier circuit, and a second electrode is connected to a second AC output terminal of the inverter circuit; and
a fourth switch, of which a control electrode is connected to the output terminal of the first NAND gate, a first electrode is connected to the second AC output terminal of the inverter circuit, and a second electrode is connected to the second DC output terminal of the rectifier circuit.

20. The electron accelerator according to claim 19, wherein each of the first switch, the second switch, the third switch, and the fourth switch comprises an insulated gate bipolar transistor.

* * * * *